(12) United States Patent
Zhou

(10) Patent No.: US 11,508,833 B2
(45) Date of Patent: Nov. 22, 2022

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 17/031,159

(22) Filed: Sep. 24, 2020

(65) Prior Publication Data

US 2021/0098608 A1 Apr. 1, 2021

(30) Foreign Application Priority Data

Sep. 26, 2019 (CN) .......................... 201910918281.1

(51) Int. Cl.
*H01L 29/66* (2006.01)
*H01L 29/78* (2006.01)
*H01L 21/8234* (2006.01)

(52) U.S. Cl.
CPC ............... *H01L 29/66795* (2013.01); *H01L 21/823431* (2013.01); *H01L 21/823468* (2013.01); *H01L 29/6656* (2013.01); *H01L 29/7851* (2013.01)

(58) Field of Classification Search
CPC ....... H01L 21/28141; H01L 21/823431; H01L 21/823468; H01L 21/823821; H01L 21/823864; H01L 21/845; H01L 27/0886; H01L 27/0924; H01L 27/10879; H01L 27/1211; H01L 29/0653; H01L 29/41791; H01L 29/6653; H01L 29/66553; H01L 29/66566; H01L 29/6795; H01L 29/785; H01L 29/7851; H01L 29/7853; H01L 29/7855; H01L 2029/7858
See application file for complete search history.

(56) References Cited

U.S. PATENT DOCUMENTS

| | | | | |
|---|---|---|---|---|
| 9,685,440 B1 * | 6/2017 | Cheng | ................ | H01L 21/3086 |
| 2014/0291761 A1 * | 10/2014 | Cheng | ................ | H01L 29/7856 257/347 |
| 2016/0071771 A1 * | 3/2016 | Colburn | ............ | H01L 21/31122 438/283 |
| 2018/0315602 A1 * | 11/2018 | Tseng | ................ | H01L 21/3086 |

* cited by examiner

*Primary Examiner* — David C Spalla
(74) *Attorney, Agent, or Firm* — Anova Law Group, PLLC

(57) ABSTRACT

A semiconductor device and a method for forming the semiconductor device are provided. The method includes providing a substrate and forming a plurality of core layers discretely arranged on the substrate. The method also includes forming a first sidewall spacer on a sidewall of a core layer of the plurality of core layers. In addition, the method includes removing the first sidewall spacer on a sidewall of at least one core layer; and forming a second sidewall spacer on the sidewall of the at least one core layer where the first sidewall spacer is removed. The first sidewall spacer is made of a material different from the second sidewall spacer.

15 Claims, 5 Drawing Sheets

SEMICONDUCTOR DEVICE AND FABRICATION METHOD THEREOF

CROSS-REFERENCE TO RELATED APPLICATIONS

This application claims the priority of Chinese patent application No. 201910918281.1, filed on Sep. 26, 2019, the entirety of which is incorporated herein by reference.

FIELD OF THE DISCLOSURE

The present disclosure generally relates to the field of semiconductor manufacturing technology and, more particularly, relates to a semiconductor device and a fabrication method thereof.

BACKGROUND

With rapid development of semiconductor manufacturing technology, semiconductor devices have been developed towards higher component density and higher degree of integration. As the most basic semiconductor devices, transistors are currently being widely used. In order to adapt to a smaller critical dimension, a channel length of a traditional planar metal-oxide-semiconductor field-effect transistor (MOSFET) is also increasingly smaller. However, as a channel length of a device keeps shrinking, the channel control capability of a gate structure deteriorates, and there is increasing difficulty in pinching the channel off by a gate voltage, resulting in a higher risk of subthreshold leakage, that is, the so-called short-channel effect (SCE). Consequently, the electrical performance of the semiconductor device may be degraded.

To overcome the short-channel effect of the device and to suppress the leakage current, a fin field-effect transistor (FinFET) has been proposed in the existing technology. The FinFET is a common multi-gate device. A structure of the FinFET includes a fin and an isolation structure on a surface of a semiconductor substrate. The isolation structure covers a portion of the sidewall of the fin, and a surface of the isolation structure is lower than a top of the fin. The FinFET also includes a gate structure on the surface of the isolation structure and on the top and sidewall surfaces of the fin. Further, the FinFET includes a source region and a drain region in the fin on both sides of the gate structure.

However, as the size of the semiconductor device shrinks and device density increases, the process difficulty of forming the FinFET increases, and the device performance of the formed FinFET is unstable. The disclosed methods and device structures are directed to solve one or more problems set forth above and other problems.

BRIEF SUMMARY OF THE DISCLOSURE

One aspect of the present disclosure includes a method for forming a semiconductor device, including: providing a substrate; forming a plurality of core layers discretely arranged on the substrate; forming a first sidewall spacer on a sidewall of a core layer of the plurality of core layers; removing the first sidewall spacer on a sidewall of at least one core layer; and forming a second sidewall spacer on the sidewall of the at least one core layer where the first sidewall spacer is removed, where the first sidewall spacer is made of a material different from the second sidewall spacer.

Optionally, the first sidewall spacer is made of a material including silicon nitride, silicon oxide, silicon carbide, silicon oxynitride, or a combination thereof.

Optionally, the second sidewall spacer is made of a material including silicon oxide, silicon nitride, silicon oxynitride, silicon oxycarbide, silicon carbonitride, silicon oxy-carbo-nitride, or a combination thereof.

Optionally, the core layer is made of a material including amorphous silicon, polysilicon, amorphous carbon, or a combination thereof.

Optionally, before removing the first sidewall spacer on the sidewall of the at least one core layer, the method further includes forming a dielectric layer on the substrate, where a top surface of the dielectric layer is coplanar with the top surface of the core layer; and forming a hard mask layer on the dielectric layer, on the core layer, and on the first sidewall spacer, where the hard mask layer has an opening exposing the top surface of the first sidewall spacer on the sidewall of the at least one core layer.

Optionally, removing the first sidewall spacer includes a dry etching process, a wet etching process, or a combination thereof.

Optionally, forming the first sidewall spacer includes a chemical vapor deposition process, an atomic layer deposition process, a physical vapor deposition process, or a combination thereof.

Optionally, forming the second sidewall spacer includes a chemical vapor deposition process, an atomic layer deposition process, a physical vapor deposition process, or a combination thereof.

Optionally, after forming the second sidewall spacer, the method further includes removing the plurality of core layers; using the first sidewall spacer and the second sidewall spacer as a mask, etching a first portion of the substrate along a thickness direction; removing the second sidewall spacer; and using the first sidewall spacer as a mask, etching a second portion of the substrate along the thickness direction to form a fin on the substrate.

Optionally, removing the second sidewall spacer includes a dry etching process, a wet etching process, or a combination thereof.

Optionally, etching the first portion and the second portion of the substrate along the thickness direction includes a dry etching process, a wet etching process, or a combination thereof.

Optionally, after forming the second sidewall spacer, the method further includes removing the hard mask layer; and removing the plurality of core layers and the dielectric layer.

Optionally, removing the plurality of core layers and the dielectric layer includes a dry etching process, a wet etching process, or a combination thereof.

Optionally, the dielectric layer is made of a material including silicon carbide, silicon oxide, silicon nitride, silicon boronitride, silicon oxy-carbo-nitride, silicon oxynitride, or a combination thereof.

Optionally, forming the dielectric layer includes a chemical vapor deposition process, an atomic layer deposition process, a physical vapor deposition process, or a combination thereof.

Optionally, the hard mask layer is made of a material including silicon carbide, silicon nitride, silicon oxycarbide, or a combination thereof.

Another aspect of the present disclosure includes a semiconductor device, including: a substrate; a plurality of core layers discretely arranged on the substrate; a first sidewall spacer on a sidewall of a core layer of the plurality of core layers, where a top surface of the first sidewall spacer is coplanar with a top surface of the core layer; and a second sidewall spacer on a sidewall of at least one core layer, where the first sidewall spacer is made of a material different from the second sidewall spacer.

Optionally, the first sidewall spacer is made of a material including silicon nitride, silicon oxide, silicon carbide, silicon oxynitride, or a combination thereof.

Optionally, the second sidewall spacer is made of a material including silicon oxide, silicon nitride, silicon oxynitride, silicon oxycarbide, silicon carbonitride, silicon oxy-carbo-nitride, or a combination thereof.

Optionally, the core layer is made of a material including amorphous silicon, polysilicon, amorphous carbon, or a combination thereof.

The disclosed embodiments may have following beneficial effects. One or more core layers may be formed on the substrate. After the first sidewall spacer is formed on the sidewall of the core layer, the first sidewall spacer on a sidewall of at least one core layer may be removed, and a second sidewall spacer may be formed on the sidewall of the core layer where the first sidewall spacer is removed. The first sidewall spacer may be made of a material different from the first sidewall spacer. Therefore, when subsequently removing the core layer and using the first sidewall spacer and the second sidewall spacer as a mask to etch a first portion of the substrate along a thickness direction, the position of the to-be-formed fin may be initially defined. Because the first sidewall spacer is made of a material different form the second sidewall spacer, a sidewall spacer (the first sidewall spacer or the second sidewall spacer) at a position where the fin does not need to be formed may be removed. When using the remaining sidewall spacer as a mask to etch the substrate to form the fin, the fin may not be formed at the position where the fin does not need to be formed. Therefore, the formation process of the fin may be simplified, and the quality of formed fin may be improved.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
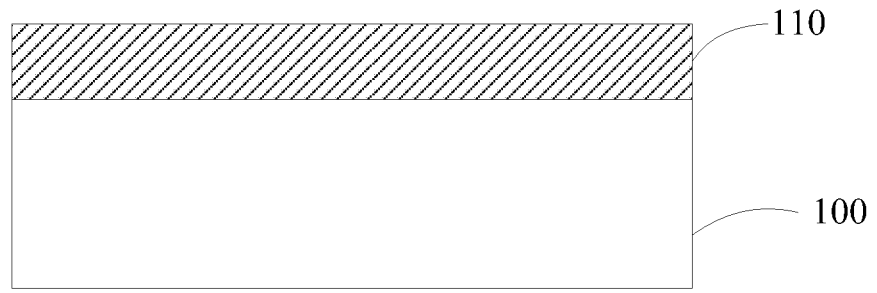
FIGS. 1-4 illustrate semiconductor structures corresponding to certain stages for forming a semiconductor device.

FIGS. 1-4 illustrate semiconductor structures corresponding to certain stages for forming a semiconductor device. Referring to FIG. 1, a substrate 100 is provided, and a hard mask layer 110 is formed on the substrate 100.

Figure 2:
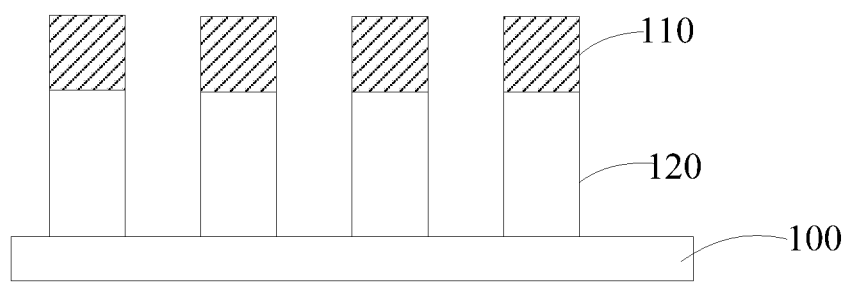

Referring to FIG. 2, the hard mask layer 110 and a portion of the substrate 100 along a thickness direction are etched, to form a plurality of discretely arranged fins 120 on the substrate 100.

Before etching the hard mask layer 110, a patterned layer (not illustrated in the Figure) is formed on the hard mask layer 110. Using the patterned layer as a mask, the hard mask layer 110 and the portion of the substrate 100 along the thickness direction are etched to form the plurality of discretely arranged fins 120 on the substrate 100. Then, the patterned layer is removed.

Figure 3:
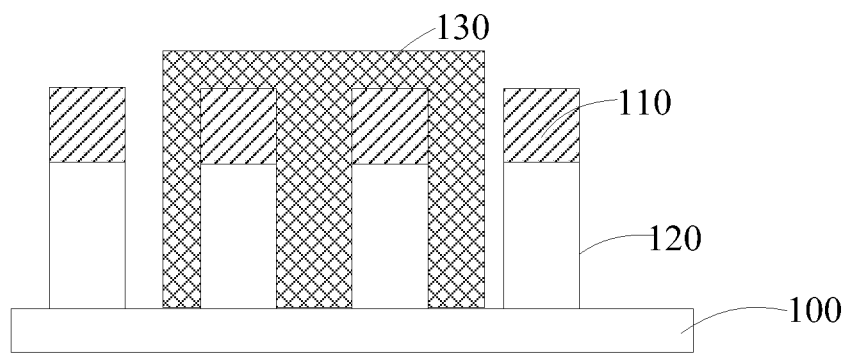

Referring to FIG. 3, a photoresist layer 130 is formed over the substrate 100. The photoresist layer 130 exposes at least sidewalls of a part of the plurality of fins 120.

Figure 4:
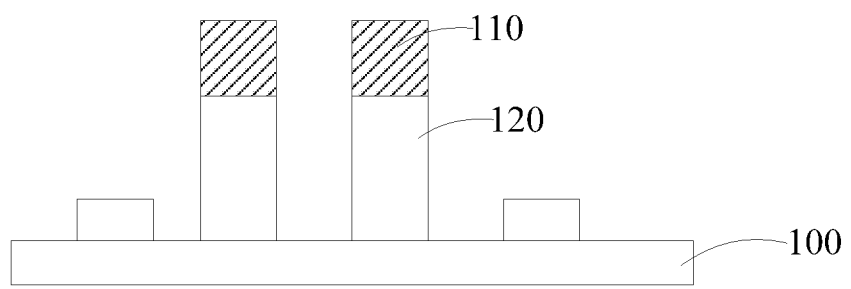

Referring to FIG. 4, the part of the plurality of fins 120 exposed by the photoresist layer 130 is at least partially removed, leaving fins 120 formed at required positions over the substrate 100. Then, the photoresist layer 130 is removed.

After the plurality of fins 120 are formed, using the photoresist 130 as a mask, the part of the plurality of fins exposed by the photoresist layer 130 is at least partially removed, leaving the fins formed at the required positions over the substrate 100. In other words, the unnecessary fin is removed to form the fin that meets the requirements. However, the surface quality of the fin formed by such method is poor. Thus, when subsequently using such fin to form a semiconductor device, the semiconductor device tends to have phenomenon such as failure during use, which limits the application of the semiconductor device. This is because as the size of semiconductor device continues to shrink, a distance between the fins becomes smaller and smaller. On the one hand, when forming the photoresist layer, the opening size of the photoresist layer is difficult to be well controlled, to-be-removed fin cannot be accurately aligned, and the process difficulty increases. On the other hand, when removing the exposed fin, because the distance between fins is small, the surrounding fin tends to be damaged, thereby causing the formed fin to have substantially poor quality, which affects the quality of the formed semiconductor device.

After one or more core layers are formed on the substrate, a first sidewall spacer and a second sidewall spacer made of different materials may be formed on a sidewall of at least one core layer. The formed first sidewall spacer and second sidewall spacer may be used to initially define a position of the to-be-formed fin. Because the first sidewall spacer and the second sidewall spacer are made of different materials, the first sidewall spacer or the second sidewall spacer at a position where the fin does not need to be formed may be removed. Therefore, when using the first sidewall spacer or the second sidewall spacer as a mask to etch a portion of the substrate along a thickness direction to form the fin on the substrate, the fin may not be formed at the position where the fin does not need to be formed, and the fin may be directly formed at the position where the fin needs to be formed. Thus, the formation process of the fin may be simplified, and the quality of the formed fin may be improved, thereby improving the quality and stability of the formed semiconductor device, and expanding the application range of the semiconductor device.

Figure 13:
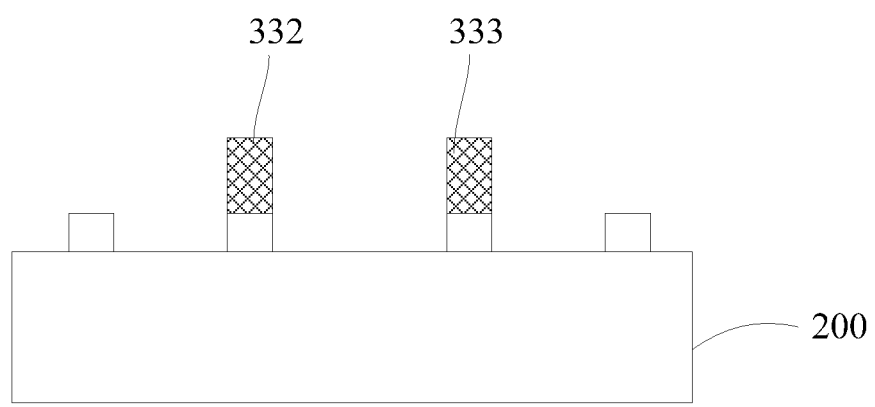
Figure 14:
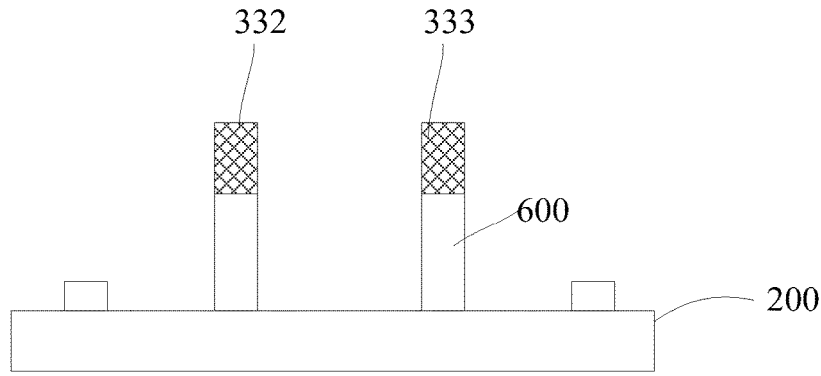
Figure 15:
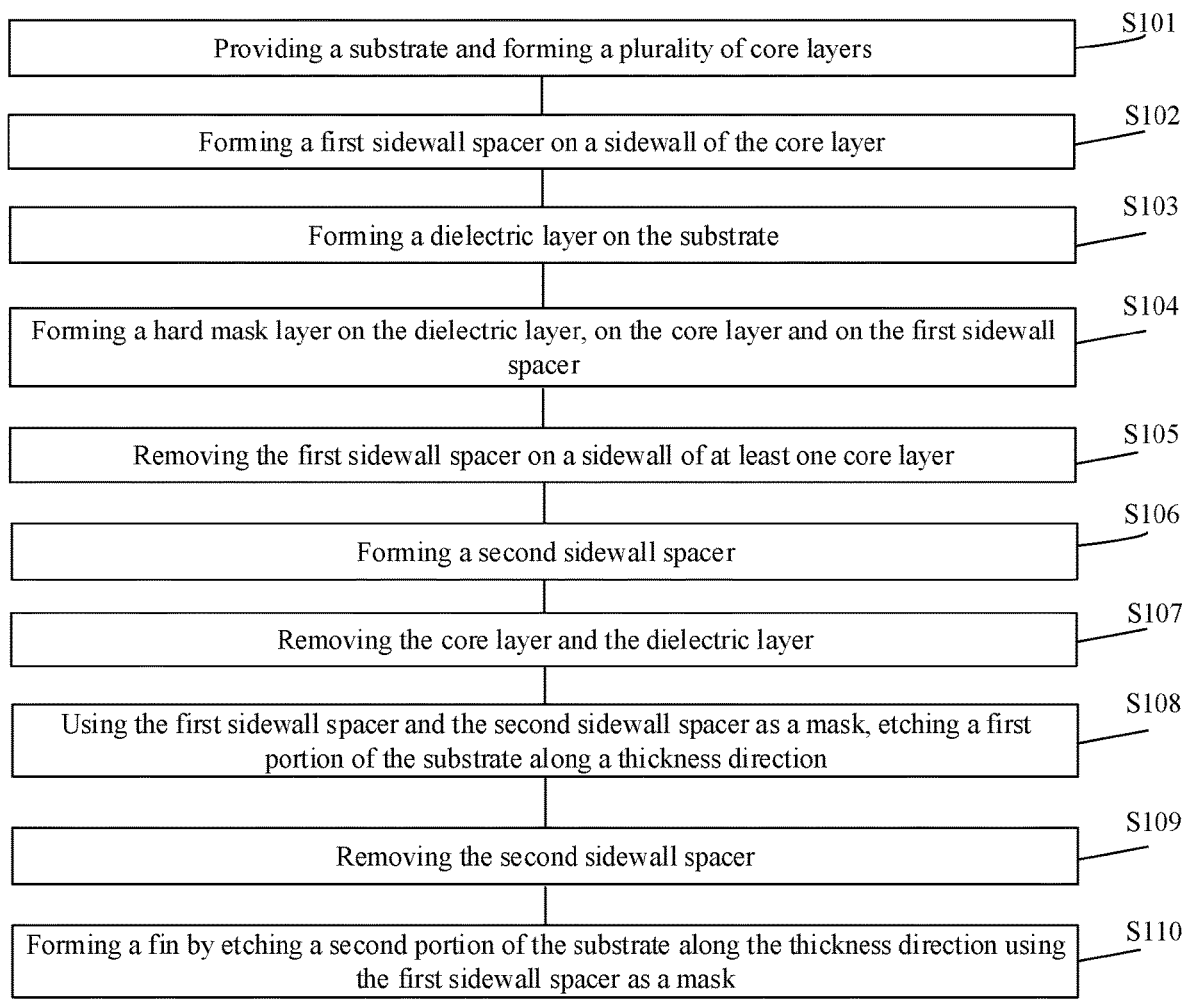
FIG. 15 illustrates a flowchart of an exemplary method for forming a semiconductor device consistent with various disclosed embodiments of the present disclosure.

The present disclosure provides a semiconductor device and a method for forming the semiconductor device. FIG. 15 illustrates a flowchart of a method for forming a semiconductor device consistent with various disclosed embodiments of the present disclosure, and FIGS. 5-14 illustrate semiconductor structures corresponding to certain stages of the fabrication method.

Figure 5:
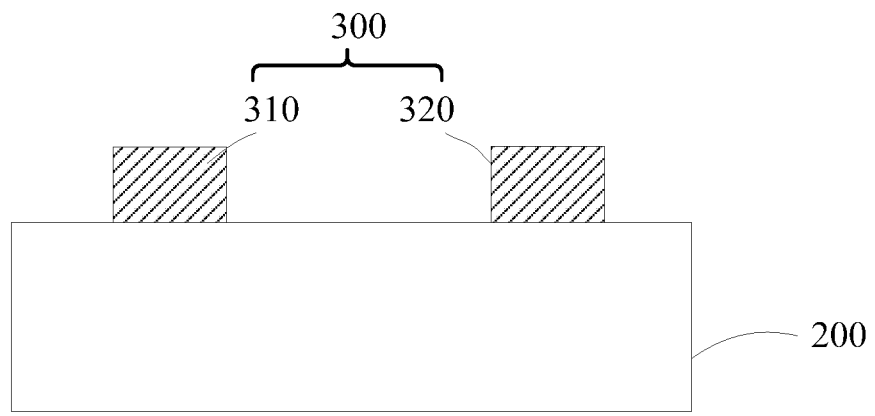
FIGS. 5-14 illustrate semiconductor structures corresponding to certain stages for forming an exemplary semiconductor device consistent with various disclosed embodiments of the present disclosure.

As shown in FIG. 15, at the beginning of the fabrication method, a substrate may be provided and a plurality of core layers may be formed (S101). FIG. 5 illustrates a corresponding semiconductor structure.

Referring to FIG. 5, a substrate 200 may be provided, and a plurality of discretely arranged core layers 300 may be formed on the substrate 200. In one embodiment, the substrate 200 may be made of silicon. In another embodiment, the substrate 200 may be made of monocrystalline silicon, polysilicon, amorphous silicon, germanium, silicon germanium, gallium arsenide, or any other suitable semiconductor material.

In one embodiment, the core layer 300 may be made of amorphous carbon. In another embodiment, the core layer 300 may be made of one or more of amorphous silicon, polysilicon, and amorphous carbon.

In one embodiment, forming the core layer 300 may include: first forming a material layer of the core layer with a certain thickness on the substrate 200 by a chemical deposition method; forming a photoresist layer on the material layer of the core layer; using the photoresist layer as a mask, etching the material layer of the core layer to form the core layer 300; and removing the photoresist layer.

In one embodiment, two core layers 300, namely a first core layer 310 and a second core layer 320, may be formed on the substrate 200. In another embodiment, a different quantity (e.g., one, three, four, etc.) of the core layers 300 may be formed on the substrate 200.

In one embodiment, the material layer of the core layer 300 may be formed by a chemical vapor deposition method. In another embodiment, the material layer of the core layer 300 may be formed by an atomic layer deposition method, a physical vapor deposition method, or a combination thereof.

In one embodiment, the material layer of the core layer may be etched by a dry etching process, to form the plurality of discretely arranged core layers 300 on the substrate 200. In another embodiment, the material layer of the core layer may be etched by a wet etching process, to form the plurality of discretely arranged core layers 300 on the substrate 200.

Figure 6:
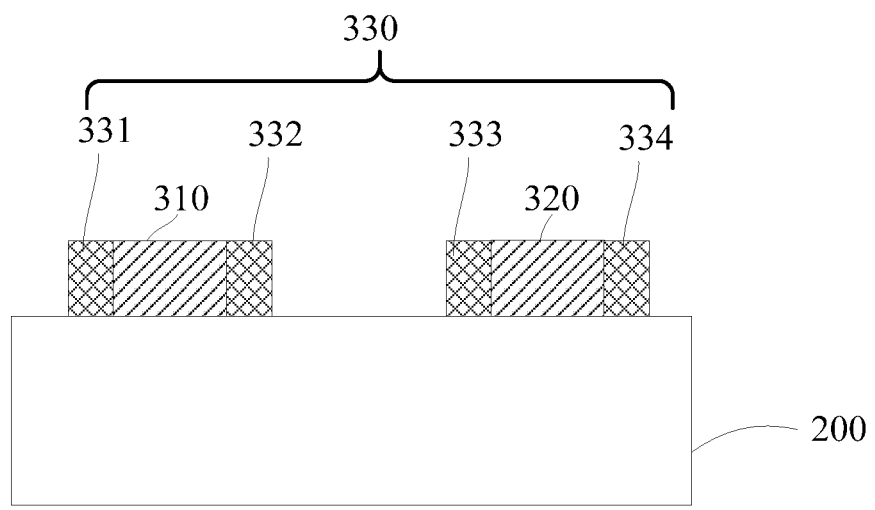

Returning to FIG. 15, after forming the plurality of core layers, a first sidewall spacer may be formed (S102). FIG. 6 illustrates a corresponding semiconductor structure.

Referring to FIG. 6, a first sidewall spacer 330 may be formed on a sidewall of the core layer 300. A top surface of the first sidewall spacer 330 may be coplanar with a top surface of the core layer 300.

In one embodiment, the first sidewall spacer 330 formed on the sidewall of the first core layer 310 may include a first sub-sidewall spacer 331 and a second sub-sidewall spacer 332. The first sidewall spacer 330 formed on the sidewall of the second core layer 320 may include a third sub-sidewall spacer 333 and a fourth sub-sidewall spacer 334.

In one embodiment, the first sidewall spacer 330 may be made of silicon nitride. In another embodiment, the first sidewall spacer 330 may be made of one or more of silicon nitride, silicon oxide, silicon carbide and silicon oxynitride. In one embodiment, the first sidewall spacer 330 may have a single-layer structure. In another embodiment, the first sidewall spacer 330 may have a stacked structure.

In one embodiment, forming the first sidewall spacer 330 may include: forming a material layer of the first sidewall spacer 330 on the substrate 200 and on top and sidewalls of the core layers 300 (i.e., the first core layer 310 and the second core layer 320); back-etching the material layer of the first sidewall spacer 330 until the surface of the substrate 200 is exposed, to form the first sidewall spacer 330 on the sidewalls of the first core layer 310 and the second core layer 320.

In one embodiment, the material layer of the first sidewall spacer 330 may be formed by an atomic layer deposition method. In another embodiment, the material layer of the first sidewall spacer 330 may be formed by a chemical vapor deposition method, a physical vapor deposition method, or a combination thereof.

In one embodiment, process parameters for forming the material layer of the first sidewall spacer 330 may include: gas including Dichlorosilane (DCS, $SiH_2Cl_2$) or ammonia ($NH_3$), where a flow rate of the gas may be in a range of approximately 1500 sccm-4000 sccm; a temperature in a range of approximately 200° C.-600° C.; and an etching pressure in a range of approximately 1 mTorr-10 mTorr.

In one embodiment, the material layer of the first sidewall spacer 330 may be etched by a dry etching process. In another embodiment, the material layer of the first sidewall spacer 330 may be etched by a wet etching process.

In one embodiment, parameters of the dry etching process may include: an etching atmosphere including carbon tetrafluoride ($CF_4$), $CH_3F$ and oxygen ($O_2$), where a flow rate of the $CF_4$ gas may be in a range of approximately 5 sccm-100 sccm, a flow rate of the $CH_3F$ gas may be in a range of approximately 8 sccm-250 sccm, a flow rate of the oxygen ($O_2$) gas may be in a range of approximately 10 sccm-400 sccm; a source radio frequency (RF) power in a range of approximately 50 W-300 W; a voltage in a range of approximately 30 V-100 V; an etching treatment duration in a range of approximately 4 s-50 s; and an etching pressure in a range of approximately 10 mTorr-2000 mTorr.

Figure 7:
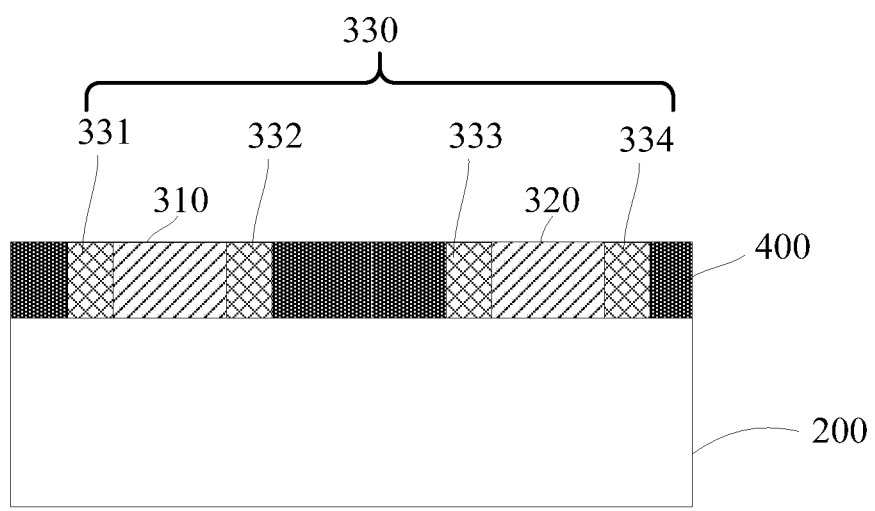

Returning to FIG. 15, after forming the first sidewall spacer, a dielectric layer may be formed (S103). FIG. 7 illustrates a corresponding semiconductor structure.

Referring to FIG. 7, a dielectric layer 400 may be formed on the substrate 200, and a top of the dielectric layer 400 may be coplanar with the top of the core layer 300.

In one embodiment, the dielectric layer 400 may be made of silicon carbide. In another embodiment, the dielectric layer 400 may be made of one or more of silicon oxide, silicon nitride, silicon boronitride, silicon oxy-carbo-nitride, and silicon oxynitride.

In one embodiment, the dielectric layer 400 may be formed by a chemical vapor deposition process. In another embodiment, the dielectric layer 400 may be formed by an atomic layer deposition process, a physical vapor deposition process, or a combination thereof.

In one embodiment, process parameters for forming the dielectric layer 400 by a chemical vapor deposition process may include: gases including hydrogen, HCl, $SiH_2Cl_2$ and $PH_3$, where a flow rate of hydrogen may be in a range of approximately 2000 sccm-20000 sccm, a flow rate of HCl may be in a range of approximately 30 sccm-150 sccm, a flow rate of $SiH_2Cl_2$ may be in a range of approximately 50 sccm-1000 sccm, and a flow rate of $PH_3$ may be in a range of approximately 10 sccm-2000 sccm; a chamber pressure in a range of approximately 10 Torr-600 Torr; and a temperature in a range of approximately 650° C.-850° C.

In one embodiment, forming the dielectric layer may include: forming a material layer of the dielectric layer 400 over the substrate 200, where the material layer of the dielectric layer 400 may cover the core layer 300 and the first sidewall spacer 330; and back-etching the material layer of the dielectric layer 400 to expose the top surfaces of the core layer 300 and the first sidewall spacer 330, where the top surface of the dielectric layer 400 may be coplanar with the top surfaces of the core layer 300 and the first sidewall spacer 330.

In one embodiment, back-etching the material layer of the dielectric layer 400 may include a dry etching process. In another embodiment, back-etching the material layer of the dielectric layer 400 may include a wet etching process.

In one embodiment, process parameters for etching the material layer of the dielectric layer 400 may include: an etching atmosphere including helium (He), ammonia ($NH_3$) and $NF_3$, where a flow rate of the helium (He) gas may be in a range of approximately 600 sccm-2000 sccm, a flow rate of the ammonia ($NH_3$) gas may be in a range of approximately 200 sccm-5000 sccm, a flow rate of the $NF_3$ gas may be in a range of approximately 20 sccm-2000 sccm; an etching pressure in a range of approximately 2 mTorr-100 mTorr; and an etching treatment duration in a range of approximately 20 s-1000 s.

In one embodiment, the dielectric layer 400 formed on the substrate 200 may protect the surface of the substrate 200 from being damaged in subsequent processes.

Figure 8:
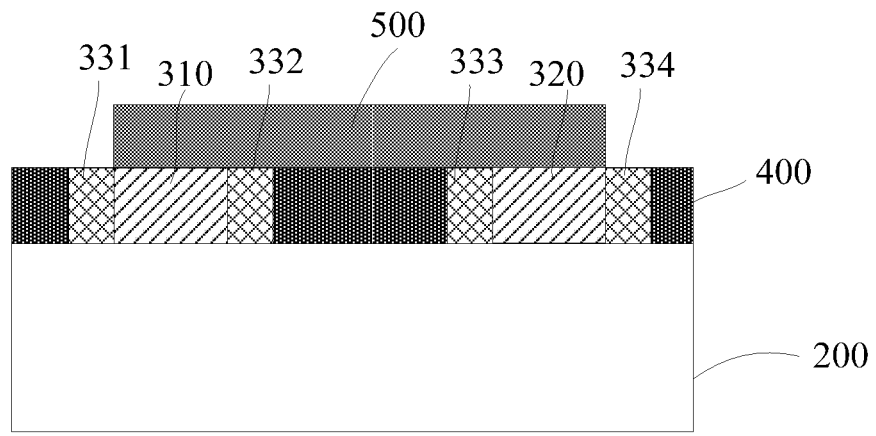

Returning to FIG. 15, after forming the dielectric layer, a hard mask layer may be formed (S104). FIG. 8 illustrates a corresponding semiconductor structure.

Referring to FIG. 8, a hard mask layer 500 may be formed on the dielectric layer 400, on the core layer 300, and on the first sidewall spacer 330. The hard mask layer 500 may have an opening exposing the top of the first sidewall spacer 330 on a sidewall of at least one core layer 300.

In one embodiment, the opening of the hard mask layer 500 may expose the top of the first sub-sidewall spacer 331 on the sidewall of the first core layer 310 and the top of the fourth sub-sidewall spacer 334 on the sidewall of the second core layer 320. In another embodiment, the opening of the hard mask layer 500 may expose the top of the first sub-sidewall spacer 331 on the sidewall of the first core layer 310 or the top of the third sub-sidewall spacer 333 on the sidewall of the second core layer 320. In certain embodiments, the opening of the hard mask layer 500 may simultaneously expose the top of the first sub-sidewall spacer 331 on the sidewall of the first core layer 310 and the top of the third sub-sidewall spacer 333 on the sidewall of the second core layer 320. The opening of the hard mask layer may expose the top of the first sidewall spacer 330 that needs to be exposed according to actual needs, which is not limited by the present disclosure.

In one embodiment, the hard mask layer 500 may be made of silicon oxycarbide. In another embodiment, the hard mask layer 500 may be made of silicon nitride, silicon carbide, silicon oxycarbide, or a combination thereof.

In one embodiment, the hard mask layer 500 may be formed on the dielectric layer 400, on the core layer 300, and on the first sidewall spacer 330 by a hot filament chemical vapor deposition method. In another embodiment, the hard mask layer 500 may be formed on the dielectric layer 400, on the core layer 300, and on the first sidewall spacer 330 by a plasma enhanced chemical vapor deposition method, a low pressure chemical vapor deposition method, or a combination thereof.

Figure 9:
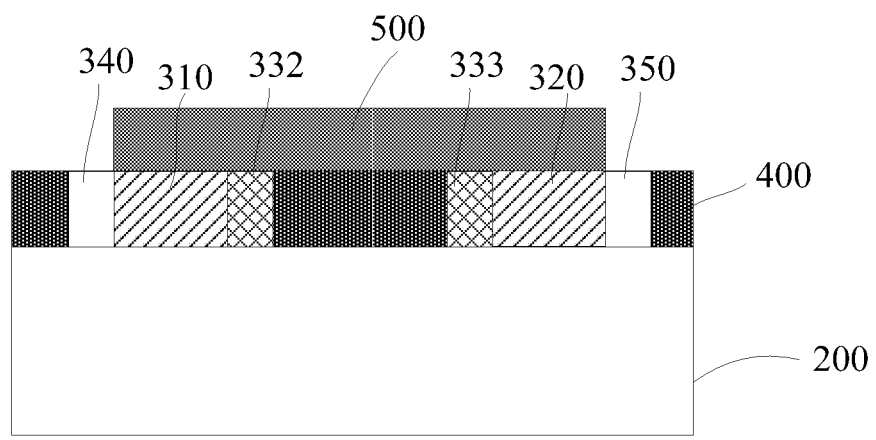

Returning to FIG. 15, after forming the hard mask layer, the first sidewall spacer on a sidewall of at least one core layer may be removed (S105). FIG. 9 illustrates a corresponding semiconductor structure.

Referring to FIG. 9, the first sidewall spacer 330 on a sidewall of at least one core layer 300 may be removed. In one embodiment, the opening of the hard mask layer 500 may simultaneously expose the top of the first sub-sidewall spacer 331 on the sidewall of the first core layer 310 and the top of the fourth sub-sidewall spacer 334 on the sidewall of the second core layer 320. Therefore, the first sub-sidewall spacer 331 on the sidewall of the first core layer 310 and the fourth sub-sidewall spacer 334 on the sidewall of the second core layer 320 may be simultaneously removed, to form a first opening 340 and a second opening 350 between the dielectric layer 400 and the core layer 300, respectively. The bottom of the first opening 340 and the second opening 350 may expose the top surface of the substrate 200.

In one embodiment, removing the first sidewall 330 may include removing the first sub-sidewall spacer 331 and the fourth sub-sidewall spacer 334. The first sub-sidewall spacer 331 and the fourth sub-sidewall spacer 334 may be removed by a dry etching process. Parameters of the dry etching process may include: a main etching gas including a fluorine-containing gas, e.g., $CF_4$, $NF_3$, or $SF_6$, where a flow rate of the etching gas may be in a range of approximately 10 sccm-400 sccm; a chamber pressure in a range of approximately 10 mTorr-1000 mTorr; a RF power in a range of approximately 50 W-500 W; a bias voltage in a range of approximately 30 V-200 V, and an etching duration in a range of approximately 10 s-100 s. In another embodiment, the first sub-sidewall spacer 331 and the fourth sub-sidewall spacer 334 may be removed by a wet etching process.

Figure 10:
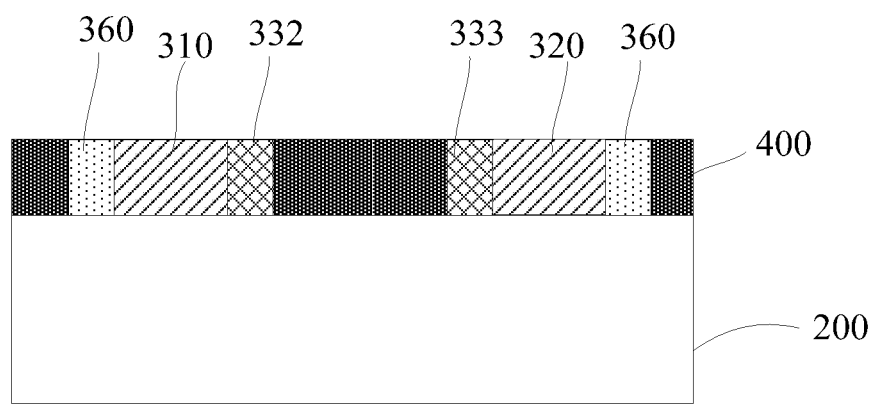

Returning to FIG. 15, after removing the first sidewall spacer on the sidewall of at least one core layer, a second sidewall spacer may be formed (S106). FIG. 10 illustrates a corresponding semiconductor structure.

Referring to FIG. 10, a second sidewall spacer 360 may be formed on the sidewall of the core layer 300 where the first sidewall spacer 330 is removed. In one embodiment, the first sub-sidewall spacer 331 and the fourth sub-sidewall spacer 334 may be removed, to form the first opening 340 and the second opening 350 between the dielectric layer 400 and the core layer 300. The second sidewall spacer 360 may be formed in the first opening 340 and the second opening 350.

The second sidewall spacer 360 may be made of a material different from the first sidewall spacer 330. In one embodiment, the second sidewall spacer 360 may be made of silicon oxide. In another embodiment, the second sidewall spacer 360 may be made of one or more of silicon oxide, silicon nitride, silicon oxynitride, silicon oxycarbide, silicon carbonitride, and silicon oxy-carbo-nitride.

In one embodiment, the first sidewall spacer 330 may be made of a material different from the second sidewall spacer 360. When the fin does not need to be formed on the substrate at a position corresponding to the bottom of the first sidewall spacer 330 or the bottom of the second sidewall spacer 360, the corresponding first sidewall spacer 330 or the second sidewall spacer 360 may be removed. Because the first sidewall spacer 330 is made of a material different from the second sidewall spacer 360, when removing the first sidewall spacer 330 (or the second sidewall spacer 360), the second sidewall spacer 360 (or the first sidewall spacer 330) may not be removed. When subsequently forming the fin by etching a portion of the substrate 200 along a thickness direction using remaining sidewall spacer as a mask, the fin may not be formed at the entire positions where the first sidewall spacer 330 and the second sidewall spacer 360 were originally formed, and the fin may be merely formed on the substrate 200 at a position corresponding to the remaining sidewall spacer. Therefore, the fin may be formed at a position where the fin needs to be formed at one time, and an extra fin may not be formed. Therefore, the formation quality of the fin may be improved, the formation process of the fin may be simplified, and the production efficiency and the quality of the formed semiconductor device may be improved.

In one embodiment, the second sidewall spacer 360 may be formed by an atomic layer deposition method. In another embodiment, the second sidewall spacer 360 may be formed by a chemical vapor deposition method, a physical vapor deposition method, or a combination thereof.

In one embodiment, forming the second sidewall spacer 360 may include: depositing a material of the second sidewall spacer 360 in the first opening 340 and in the second opening 350, and back-etching the material of the second sidewall spacer 360 until the top surfaces of the dielectric layer 400, the core layer 300 and the first sidewall spacer 330 are exposed.

In one embodiment, the reason of forming the second sidewall spacer 360 by an atomic layer deposition method may include that the atomic layer deposition method may have desired step coverage capacity, and may sufficiently fill the first opening 340 and the second opening 350. Therefore, the formed second sidewall spacer 360 may have desired quality, thereby improving the accuracy of pattern transfer.

In one embodiment, back-etching the second sidewall spacer 360 may include an isotropic dry etching process. Parameters of the dry etching process may include: gases including $CF_4$, $CH_3F$ and $O_2$, where a flow rate of $CF_4$ gas may be in a range of approximately 5 sccm-100 sccm, a flow rate of $CH_3F$ gas may be in a range of approximately 8 sccm-50 sccm, a flow rate of $O_2$ gas may be in a range of approximately 10 sccm-100 sccm; a chamber pressure in a range of approximately 10 mTorr-2000 mTorr; a RF power in a range of approximately 50 W-300 W; a bias voltage in a range of approximately 30 V-100 V, and an etching duration in a range of approximately 4 s-50 s.

In one embodiment, after forming the second sidewall spacer 360, the hard mask layer 500 may be removed.

Figure 11:
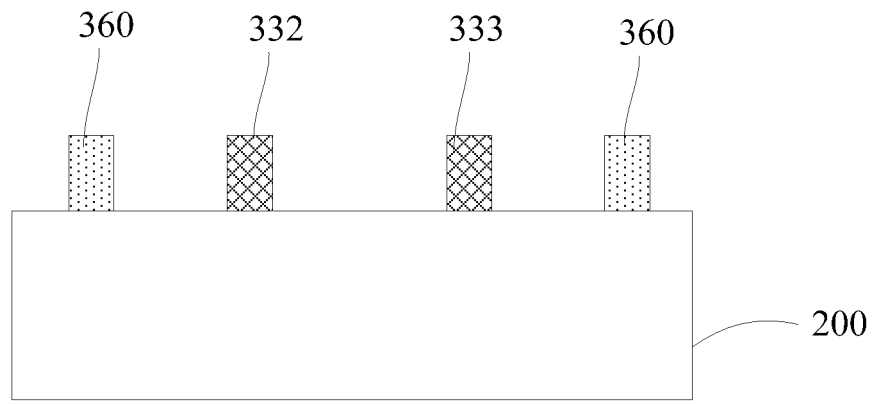

Returning to FIG. 15, after forming the second sidewall spacer, the core layer and the dielectric layer may be removed (S107). FIG. 11 illustrates a corresponding semiconductor structure.

Referring to FIG. 11, the core layer 300 and the dielectric layer 400 may be removed. In one embodiment, the core layer 300 and the dielectric layer 400 may be removed by a wet etching process. Parameters of the wet etching process may include: an etching solution of tetramethylammonium hydroxide solution, where a volume percentage of the tetramethylammonium hydroxide solution may be in a range of approximately 10%-80%; and a temperature in a range of approximately 20° C.-80° C. In another embodiment, the core layer 300 and the dielectric layer 400 may be removed by a dry etching process.

Figure 12:
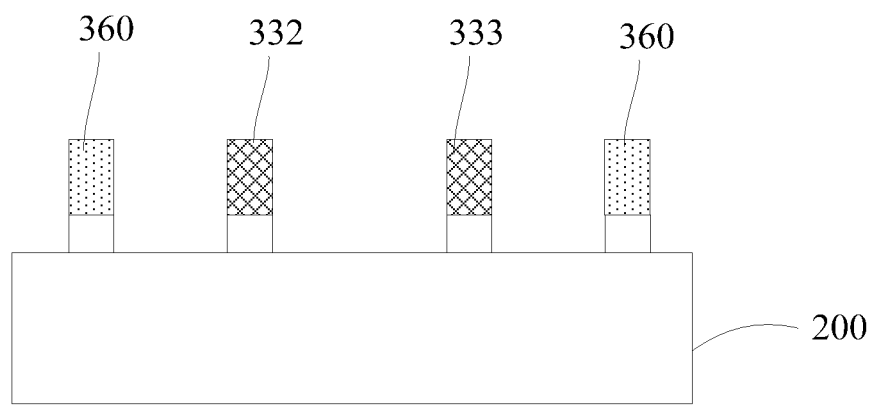

Returning to FIG. 15, after removing the core layer and the dielectric layer, a first portion of the substrate may be etched (S108). FIG. 12 illustrates a corresponding semiconductor structure.

Referring to FIG. 12, using the first sidewall spacer 330 and the second sidewall spacer 360 as a mask, a first portion of the substrate 200 along a thickness direction may be etched. In one embodiment, using the first sidewall spacer 330 as a mask may include using the second sub-sidewall spacer 332 and the third sub-sidewall spacer 333 as a mask.

In one embodiment, a first portion of the substrate 200 along the thickness direction may be first etched by using the first sidewall spacer 330 and the second sidewall spacer 360 as a mask, to define a position of an active fin. The active fin may serve as a channel.

Returning to FIG. 15, after etching the first portion of the substrate, the second sidewall spacer may be removed (S109). FIG. 13 illustrates a corresponding semiconductor structure.

Referring to FIG. 13, the second sidewall spacer 360 may be removed. In one embodiment, the second sidewall spacer 360 may be removed. In another embodiment, the first sidewall spacer 330 may be removed.

In one embodiment, the second sidewall spacer 360 may be removed by a dry etching process. Parameters of the dry etching process may include: an etching gas including fluorine-containing gas (e.g., $CH_3F$, $CH_2F_2$, or $CHF_3$), argon and oxygen; an etching power in a range of approximately 200 W-400 W; a pressure of an etching chamber in a range of approximately 30 mTorr-200 mTorr; and an etching temperature in a range of approximately 40° C.-60° C.

Returning to FIG. 15, after removing the second sidewall spacer, a fin may be formed (S110). FIG. 14 illustrates a corresponding semiconductor structure.

Referring to FIG. 14, using the first sidewall spacer 330 as a mask, a second portion of the substrate 200 along the thickness direction may be etched to form a fin 600 on the substrate 200. In one embodiment, using the first sidewall spacer 330 as a mask may include using the second sub-sidewall spacer 332 and the third sub-sidewall spacer 333 as a mask.

In one embodiment, the fin 600 may be formed by a dry etching process. In another embodiment, the fin 600 may be formed by a wet etching process. In one embodiment, the dry etching process may include an anisotropic dry etching process. Parameters of the dry etching process may include an etching gas including HBr and Ar, where a flow rate of HBr may be in a range of approximately 10 sccm-1000 sccm, and a flow rate of Ar may be in a range of approximately 10 sccm-1000 sccm.

In one embodiment, because a second portion of the substrate 200 along the thickness direction is etched using the first sidewall spacer 330 as a mask, the fin 600 may be formed on the substrate 200 at a position corresponding to the first sidewall spacer 330, and the fin may not be formed at any other position where the fin does not need to be formed. Therefore, the formation process of the fin may be simplified. At the same time, after the fin 600 is formed, the surface of the fin may not be damaged, thereby improving the quality of the formed fin. Therefore, the fin formed by such method may be used to form a semiconductor device, and the quality and device performance of the semiconductor device may be improved.

Correspondingly, the present disclosure also provides a semiconductor device formed by the above-disclosed method. The semiconductor device may include a substrate 200; a plurality of core layers 300 discretely arranged on the substrate 200; a first sidewall spacer 330 on a sidewall of a core layer 300, where a top surface of the first sidewall spacer 330 may be coplanar with a top surface of the core layer 300; and a second sidewall spacer 360 on a sidewall of at least on core layer 300, where the first sidewall spacer 330 may be made of a material different from the second sidewall spacer 360.

The disclosed embodiments may have following beneficial effects. One or more core layers may be formed on the substrate. After the first sidewall spacer is formed on the sidewall of the core layer, the first sidewall spacer on a sidewall of at least one core layer may be removed, and a second sidewall spacer may be formed on the sidewall of the core layer where the first sidewall spacer is removed. The first sidewall spacer may be made of a material different from the first sidewall spacer. Therefore, when subsequently removing the core layer and using the first sidewall spacer and the second sidewall spacer as a mask to etch a first portion of the substrate along a thickness direction, the position of the to-be-formed fin may be initially defined. Because the first sidewall spacer is made of a material different form the second sidewall spacer, a sidewall spacer (the first sidewall spacer or the second sidewall spacer) at a position where the fin does not need to be formed may be removed. When using the remaining sidewall spacer as a mask to etch the substrate to form the fin, the fin may not be formed at the position where the fin does not need to be formed. Therefore, the formation process of the fin may be simplified, and the quality of formed fin may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor device, comprising:
   providing a substrate;
   forming a plurality of core layers, discretely arranged on the substrate;
   forming a first sidewall spacer on a sidewall of a core layer of the plurality of core layers;
   removing the first sidewall spacer on a sidewall of at least one core layer; and
   forming a second sidewall spacer on the sidewall of the at least one core layer where the first sidewall spacer is removed, wherein the first sidewall spacer is made of a material different from the second sidewall spacer, after forming the second sidewall spacer, further including:
   removing the plurality of core layers;
   using the first sidewall spacer and the second sidewall spacer as a mask, etching a first portion of the substrate along a thickness direction;
   removing the second sidewall spacer; and
   using the first sidewall spacer as a mask, etching a second portion of the substrate along the thickness direction to form a fin on the substrate.

2. The method according to claim 1, wherein:
   the first sidewall spacer is made of a material including silicon nitride, silicon oxide, silicon carbide, silicon oxynitride, or a combination thereof.

3. The method according to claim 1, wherein:
   the second sidewall spacer is made of a material including silicon oxide, silicon nitride, silicon oxynitride, silicon oxycarbide, silicon carbonitride, silicon oxy-carbo-nitride, or a combination thereof.

4. The method according to claim 1, wherein:
   the core layer is made of a material including amorphous silicon, polysilicon, amorphous carbon, or a combination thereof.

5. The method according to claim 1, wherein:
   removing the first sidewall spacer includes a dry etching process, a wet etching process, or a combination thereof.

6. The method according to claim 1, wherein:
   forming the first sidewall spacer includes a chemical vapor deposition process, an atomic layer deposition process, a physical vapor deposition process, or a combination thereof.

7. The method according to claim 1, wherein:
   forming the second sidewall spacer includes a chemical vapor deposition process, an atomic layer deposition process, a physical vapor deposition process, or a combination thereof.

8. The method according to claim 1, wherein:
   removing the second sidewall spacer includes a dry etching process, a wet etching process, or a combination thereof.

9. The method according to claim 1, wherein:
   etching the first portion and the second portion of the substrate along the thickness direction includes a dry etching process, a wet etching process, or a combination thereof.

10. The method according to claim 1, before removing the first sidewall spacer on the sidewall of the at least one core layer, further including:
    forming a dielectric layer on the substrate, wherein a top surface of the dielectric layer is coplanar with the top surface of the core layer; and
    forming a hard mask layer on the dielectric layer, on the core layer, and on the first sidewall spacer, wherein the hard mask layer has an opening exposing the top surface of the first sidewall spacer on the sidewall of the at least one core layer.

11. The method according to claim 10, after forming the second sidewall spacer,
    further including:
    removing the hard mask layer; and
    removing the plurality of core layers and the dielectric layer.

12. The method according to claim 11, wherein:
    removing the plurality of core layers and the dielectric layer includes a dry etching process, a wet etching process, or a combination thereof.

13. The method according to claim 10, wherein:
    the dielectric layer is made of a material including silicon carbide, silicon oxide, silicon nitride, silicon boronitride, silicon oxy-carbo-nitride, silicon oxynitride, or a combination thereof.

14. The method according to claim 10, wherein:
    forming the dielectric layer includes a chemical vapor deposition process, an atomic layer deposition process, a physical vapor deposition process, or a combination thereof.

15. The method according to claim 10, wherein:
    the hard mask layer is made of a material including silicon carbide, silicon nitride, silicon oxycarbide, or a combination thereof.

* * * * *